United States Patent
Yun et al.

(10) Patent No.: US 11,485,885 B2
(45) Date of Patent: Nov. 1, 2022

(54) PRESSURE-SENSITIVE ADHESIVE COMPOSITION

(71) Applicant: LG Chem, Ltd., Seoul (KR)

(72) Inventors: Ha Song Yun, Daejeon (KR); Seung Ju Noh, Daejeon (KR); Hyun Hee Son, Daejeon (KR)

(73) Assignee: LG Chem, Ltd.

( * ) Notice: Subject to any disclaimer, the term of this patent is extended or adjusted under 35 U.S.C. 154(b) by 31 days.

(21) Appl. No.: 16/958,865

(22) PCT Filed: Jun. 5, 2019

(86) PCT No.: PCT/KR2019/006769
§ 371 (c)(1),
(2) Date: Jun. 29, 2020

(87) PCT Pub. No.: WO2019/235832
PCT Pub. Date: Dec. 12, 2019

(65) Prior Publication Data
US 2021/0054247 A1    Feb. 25, 2021

(30) Foreign Application Priority Data

Jun. 5, 2018 (KR) .................. 10-2018-0065024

(51) Int. Cl.
*C09J 133/08*    (2006.01)
*C09J 7/38*    (2018.01)
(Continued)

(52) U.S. Cl.
CPC ............ *C09J 133/08* (2013.01); *C09J 7/385* (2018.01); *C09J 11/06* (2013.01); *G02B 5/3025* (2013.01);
(Continued)

(58) Field of Classification Search
CPC ..... B32B 2457/206; C09J 7/385; C09J 11/06; C09J 133/066; C09J 133/08; C09J 133/10;
(Continued)

(56) References Cited

U.S. PATENT DOCUMENTS

2006/0279923 A1    12/2006    Kim et al.
2012/0217485 A1    8/2012    Lee et al.
(Continued)

FOREIGN PATENT DOCUMENTS

CN    105319635 A    2/2016
CN    108020876 A    5/2018
(Continued)

OTHER PUBLICATIONS

Sugimoto et al., Flexible OLED Displays Using Plastic Substrates, 2004, IEEE Journal of Selected Topics in Quantum Electronics, vol. 10, No. 1, 107-114 (Year: 2004).*
(Continued)

*Primary Examiner* — Eli D. Strah
(74) *Attorney, Agent, or Firm* — Lerner, David, Littenberg, Krumholz & Mentlik, LLP

(57) ABSTRACT

The present application relates to a pressure-sensitive adhesive composition and a use thereof. The polarizing plate to which the pressure-sensitive adhesive composition of the present application is applied has an advantage that the performance capable of blocking the blue light, for example, the light having a wavelength region of 380 nm or more, is particularly excellent, when attached to an organic light emitting panel, especially, an organic light emitting panel comprising a plastic substrate.

15 Claims, 2 Drawing Sheets

(51) Int. Cl.
  *C09J 11/06* (2006.01)
  *G02B 5/30* (2006.01)
  *H01L 51/52* (2006.01)

(52) U.S. Cl.
  CPC .... *H01L 51/5281* (2013.01); *B32B 2457/206* (2013.01); *C09K 2323/05* (2020.08); *C09K 2323/057* (2020.08)

(58) Field of Classification Search
  CPC .......... C09K 2323/05; C09K 2323/057; G02B 5/30; G02B 5/3025; G02B 5/3041; H01L 51/50; H01L 51/5281
  See application file for complete search history.

(56) References Cited

U.S. PATENT DOCUMENTS

| | | |
|---|---|---|
| 2015/0378075 A1 | 12/2015 | Gam et al. |
| 2019/0107657 A1 | 4/2019 | Jung et al. |

FOREIGN PATENT DOCUMENTS

| | | | |
|---|---|---|---|
| CN | 108020878 A | | 5/2018 |
| JP | 2018028974 A | | 2/2018 |
| JP | 2018072711 A | * | 5/2018 |
| JP | 2018072712 A | | 5/2018 |
| KR | 100784991 B1 | | 12/2007 |
| KR | 20110013220 A | | 2/2011 |
| KR | 101042477 B1 | | 6/2011 |
| KR | 20150093447 A | | 8/2015 |
| KR | 101813813 B1 | | 12/2017 |
| KR | 20180048363 A | | 5/2018 |
| KR | 20180048364 A | | 5/2018 |
| KR | 20180048365 A | | 5/2018 |
| WO | 2018034151 A1 | | 2/2018 |
| WO | WO-2018034151 A1 | * | 2/2018 ............. H05B 33/02 |

OTHER PUBLICATIONS

International Search Report for PCT/KR2019/006769 dated Sep. 5, 2019; 2 pages.
Chinese Search Report for Application No. 201980007083.8 dated May 17, 2021, pp. 1-2.
Extended European Search Report including Written Opinion for Application No. 19814584.9 dated May 27, 2021, pp. 1-8.
Search Report from Tawianese Office Action for Application No. 108119478 dated Nov. 30, 2020; 1 page.

* cited by examiner

[Figure 1]

| 20 |
|---|
| 10 |
| 30 |

[Figure 2]

| 103 |
|---|
| 101 |
| 102 |

[Figure 3]

| 201 |
|---|
| 202 |
| 203 |

[Figure 4]

| 301 |
|---|
| 303 |
| 302 |

[Figure 5]

| 403 |
|---|
| 401 |
| 404 |
| 405 |
| 406 |
| 402 |
| 407 |
| 408 |

[Figure 6]

| 403 |
|---|
| 401 |
| 405 |
| 406 |
| 402 |
| 407 |
| 408 |

[Figure 7]

| 100 |
|---|
| 701 |
| 702 |
| 703 |
| 704 |

PRESSURE-SENSITIVE ADHESIVE COMPOSITION

CROSS-REFERENCE TO RELATED APPLICATIONS

This application is a national phase entry under 35 U.S.C. § 371 of International Application No. PCT/KR2019/006769 filed Jun. 5, 2019, which claims priority from Korean Patent Application No. 10-2018-0065024 filed Jun. 5, 2018, all of which are incorporated herein by reference.

TECHNICAL FIELD

The present application relates to a pressure-sensitive adhesive composition and a use thereof.

BACKGROUND ART

As a method for implementing RGB (red, green, blue) colors in OLEDs (organic light emitting displays), a method of applying a color filter to a white OLED light source (WOLED method) or a method of constituting RGB colors with light emitting elements, respectively (RGB method), and the like is used. The RGB method can be applied to a POLED (plastic OLED), which has a problem that the lifetime is shorter than that of the WOLED method. The lifetime of the blue light source in the RGB light source is relatively short, and the lifetime of the blue light source can be shortened by the sunlight incident from the outside, for example, light with a wavelength of 380 nm or more.

However, the conventional polarizing plate is designed to have a function of blocking ultraviolet rays in order to protect the polarizer. That is, the ultraviolet ray blocking function is mainly implemented as a protective film for a polarizer, and the protective film is designed only to block light in a wavelength range of about 380 nm or less for the purpose of protecting the polarizer (see Patent Document 1).

Therefore, in a polarizing plate applied to the POLED, a blocking function for the light in a wavelength region of 380 nm or more is required for the purpose of protecting the blue light source of the POLED and extending its lifetime.

PRIOR ART DOCUMENT

Patent Document (Patent Document 1) Korean Patent No. 1042477

DISCLOSURE

Technical Problem

It is one object of the present application to provide a pressure-sensitive adhesive composition capable of blocking blue light, for example, light in a wavelength region of 380 nm or more when it is applied as an adhesive layer of a polarizing plate, where the polarizing plate is attached to an organic light emitting panel, especially, an organic light emitting panel including a plastic substrate.

Technical Solution

The present application relates to a pressure-sensitive adhesive composition. The pressure-sensitive adhesive composition of the present application may comprise a pressure-sensitive adhesive polymer and an ultraviolet absorber. The pressure-sensitive adhesive polymer may be an acrylic polymer.

In the present application, the term "pressure-sensitive adhesive composition" may mean a composition that can act as a pressure-sensitive adhesive before or after crosslinking or curing. Here, the definition of the pressure-sensitive adhesive follows the definition known in the industry.

In the present application, the pressure-sensitive adhesive polymer means a polymer whose physical properties such as its glass transition temperature are adjusted so that the pressure-sensitive adhesive performance can be expressed before and/or after crosslinking or curing. The constitutions of the above-described polymer are well known in the related field.

The pressure-sensitive adhesive composition may comprise a pressure-sensitive adhesive polymer as a main component. When the composition is in a solution state including water or an organic solvent, and the like, the ratio of the pressure-sensitive adhesive polymer as the main component may be based on the weight of the composition excluding the solvent and the like.

In the present application, the term "acrylic polymer" is a polymer containing, as a main component, a polymerization unit of an acrylic monomer. In the present application, the polymerization unit of a certain monomer means a structure that the relevant monomer is formed in the polymer through a polymerization reaction.

In the present application, the fact that a certain component B contains another component A as a main component may mean a case where the ratio of the component A in the component B is about 55 wt % or more, 60 wt % or more, 70 wt % or more, 75 wt % or more, 80 wt % or more, 85 wt % or more, or 90 wt % or more, based on the total weight of B. The upper limit of the above ratio is not particularly limited, which may be, for example, about 98 wt % or less, or 95 wt % or less.

In the present application, the term "acrylic monomer" means acrylic acid or methacrylic acid, or derivatives of the acrylic acid or methacrylic acid such as acrylic acid esters or methacrylic acid esters. In addition, the "(meth)acryl" means acryl or methacryl.

The acrylic polymer may comprise a polymerization unit of an alkyl (meth)acrylate monomer. As the alkyl (meth)acrylate monomer, for example, an alkyl (meth)acrylate monomer having an alkyl group with 1 to 14 carbon atoms may be used in consideration of cohesive force, glass transition temperatures and tackiness, and the like. In another example, the alkyl group may be an alkyl group having 2 to 14 carbon atoms, 3 to 14 carbon atoms, 4 to 14 carbon atoms, 4 to 12 carbon atoms, or 4 to 8 carbon atoms, and such an alkyl group may be linear or branched. Such a monomer can be exemplified by methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate and/or tetradecyl (meth)acrylate, and the like. It is general to apply n-butyl acrylate when adhesive force due to the glass transition temperature and the like has been considered.

The acrylic polymer may comprise a polymerization unit of an alkyl (meth)acrylate monomer as a main component. The definition of the term "main component" is as described above.

The acrylic polymer may further comprise a polymerization unit of a copolymerizable monomer having a polar functional group as an additional polymerization unit for improving cohesive force and the like. Here, the copolymerizable monomer having a polar functional group may mean a monomer copolymerizable with a compound forming an acrylic polymer such as the above-described alkyl (meth)acrylate monomer. Furthermore, after the copolymerizable monomer having a polar functional group is copolymerized to form an acrylic polymer, it may mean a monomer capable of providing a polar functional group at the side chain or terminal of the polymer. Here, the polar functional group may be a functional group capable of reacting with a crosslinking agent, which is described below, by application of heat to realize a crosslinked structure, or playing a role in improving wettability of the pressure-sensitive adhesive layer.

The polar functional group can be exemplified by a hydroxyl group, a carboxyl group or an anhydride group thereof, an acid group such as a sulfonic acid group or a phosphoric acid group, a glycidyl group, an amino group or an isocyanate group, and the like.

The copolymerizable monomer having a polar group may be, for example, a copolymerizable monomer having a hydroxyl group. The copolymerizable monomer having a hydroxyl group may be a monomer which may simultaneously contain a moiety capable of copolymerizing with other monomers forming an acrylic polymer and a hydroxyl group to provide the hydroxyl group to the acrylic polymer after polymerization. As such a monomer, a hydroxyalkyl (meth) acrylate such as 2-hydroxyethyl (meth)acrylate, 2-hydroxypropyl (meth)acrylate, 4-hydroxybutyl (meth)acrylate, 6-hydroxyhexyl (meth)acrylate or 8-hydroxyoctyl (meth) acrylate can be applied. In addition, as the copolymerizable monomer having a hydroxyl group, a hydroxyalkylene glycol (meth)acrylate such as 2-hydroxyethylene glycol (meth) acrylate or 2-hydroxypropylene glycol (meth)acrylate, and the like can also be applied. Particularly, when a crosslinking agent to be described below is a polyfunctional isocyanate compound, it may be appropriate to apply 4-hydroxybutyl acrylate as the copolymerizable monomer having a hydroxyl group from the viewpoint of securing the reactivity with it and the wettability of the pressure-sensitive adhesive layer.

The acrylic polymer may comprise, for example, a polymerization unit of a copolymerizable monomer having a polar group in a ratio of about 0.1 parts by weight to 30 parts by weight relative to 100 parts by weight of the polymerization unit of the alkyl (meth)acrylate monomer. In this specification, the term "part by weight" may mean a weight ratio between components, unless otherwise specified. In another example, the ratio may be about 0.5 parts by weight or more, 0.7 parts by weight or more, or 0.9 parts by weight or more, or may be about 25 parts by weight or less, 20 parts by weight or less, 15 parts by weight or less, 10 parts by weight or less, 5 parts by weight or less, 3 parts by weight or less, or 1.5 parts by weight or less. The above ratio can be changed in consideration of the desired cohesive force or wettability, and the like.

The acrylic polymer may further comprise a polymerization unit derived from a known monomer, for example, a nitrogen-containing monomer such as (meth)acrylonitrile, (meth)acrylamide, N-methyl (meth)acrylamide, N-vinyl pyrrolidone, N-vinyl caprolactam or N-butoxymethyl (meth)acrylamide; a styrene-based monomer such as styrene or methylstyrene; glycidyl (meth)acrylate; or a carboxylic acid vinyl ester such as vinyl acetate, and the like. Such a polymerization unit may be contained, for example, in a ratio of 20 parts by weight or less relative to 100 parts by weight of the polymerization unit of the alkyl (meth)acrylate monomer.

As the acrylic polymer, for example, a polymer having a weight average molecular weight (Mw) of 800,000 or more can be used. In this specification, the term "weight average molecular weight" may be a conversion value relative to standard polystyrene measured by GPC (gel permeation chromatograph). In the present application, the "molecular weight" may mean "a weight average molecular weight."

When the molecular weight of the polymer is 800,000 or more, the durability of the pressure-sensitive adhesive can be maintained in an appropriate range. In another example, the molecular weight may be about 850,000 or more, 900,000 or more, 950,000 or more, 1,000,000 or more, 1,100,000 or more, 1,200,000 or more, or 1,300,000 or more, or may also be about 2,500,000 or less, about 2,000,000 or less, 1,800,000 or less, 1,700,000 or less, 1,600,000 or less, or about 1,500,000 or less or so.

The acrylic polymer can be produced by a known polymerization method. For example, a monomer mixture obtained by appropriately blending the (meth)acrylic acid monomer and the polar group-containing copolymerizable monomer as described above and/or other comonomers, and the like according to desired weight ratios can be applied to a usual polymerization method, such as solution polymerization, photo polymerization, bulk polymerization, suspension polymerization or emulsion polymerization, to produce the acrylic polymer. In the polymerization process, a polymerization initiator or a chain transfer agent and the like may also be used together, if necessary.

The pressure sensitive adhesive composition of the present application may comprise a compound having ultraviolet absorption ability together with the pressure-sensitive adhesive polymer. In the present application, the compound having ultraviolet absorption ability can also be referred to as "ultraviolet absorber."

In this specification, the term "ultraviolet absorption ability" may mean a physical property exhibiting the minimum transmittance for ultraviolet rays, for example, light having a wavelength of 10 nm to 450 nm, in a transmittance spectrum for wavelengths, or exhibiting the maximum absorbance for ultraviolet rays, for example, light having a wavelength of 10 nm to 450 nm, in an absorbance spectrum for wavelengths. In this specification, the term "maximum absorption wavelength of ultraviolet absorber" may mean the wavelength representing the minimum transmittance or the maximum absorbance.

In particular, the ultraviolet absorber contained in the pressure-sensitive adhesive composition of the present application may have the maximum absorption wavelength in a range of 380 nm to 410 nm. In another example, the maximum absorption wavelength may be 385 nm or more, or 390 nm or more, and may be 405 nm or less, 400 nm or less, or 395 nm or less.

The ultraviolet absorber contained in the pressure-sensitive adhesive composition of the present application may have a half-value width at the maximum absorption wavelength in a range of 10 nm to 60 nm. The half-value width may be 15 nm or more, 20 nm or more, 25 nm or more, 30 nm or more, or 40 nm or more, and may be 55 nm or less, 50 nm or less, or 45 nm or less.

In the present application, the half-value width at the maximum absorption wavelength (full width at half maximum, FWHM) may mean a range of wavelengths capable of representing a half of the minimum transmittance in a transmittance spectrum for wavelengths, or may mean a range of wavelengths capable of representing a half of the maximum absorbance in an absorbance spectrum.

The pressure-sensitive adhesive composition comprising the ultraviolet absorber of the above-described characteristics has particularly excellent performance to block ultraviolet rays in the blue region of 380 nm or more after curing. In addition, when the pressure-sensitive adhesive composition has been applied to a polarizing plate, it can exhibit excellent durability upon evaluating reliability, while the color value of the polarizing plate are not greatly changed and the optical characteristics of the polarizing plate are not deteriorated.

The content of the ultraviolet absorber can be adjusted in view of the object of the present application. The pressure-sensitive adhesive composition may comprise the ultraviolet absorber in a ratio of 0.01 parts by weight to 10 parts by weight relative to 100 parts by weight of the acrylic polymer. When the ratio of the ultraviolet absorber is in the above range, it may be further advantageous to provide a pressure-sensitive adhesive composition having excellent performance to block ultraviolet rays in the blue region, optical characteristics of the polarizing plate and durability upon evaluating reliability. In another example, the ratio may be 0.05 parts by weight or more, 0.1 parts by weight or more, 0.5 parts by weight or more, 1 part by weight or more, 1.5 parts by weight or more, or 2 parts by weight or more, and may be 10 parts by weight or less, 9.5 parts by weight or less or so, 9 parts by weight or less or so, 8.5 parts by weight or less, 8 parts by weight or less, 7.5 parts by weight or less, 7 parts by weight or less, 6.5 parts by weight or less, 6 parts by weight or less or so, 5.5 parts by weight or less or so, 5 parts by weight or less or so, 4.5 parts by weight or less or so, or about 4 parts by weight or less or so.

In one example, the ultraviolet absorber may be a compound of Formula 1 below:

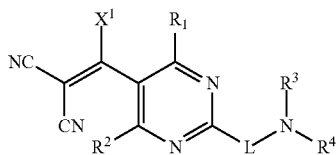

[Formula 1]

In Formula 1, $X_1$ and $R_1$ to $R_4$ may be each independently a hydrogen atom, a halogen atom, an alkyl group, an alkenyl group, an alkynyl group, an alkoxy group or an alkoxycarbonyl group, and L may be a single bond, alkylene, alkenylene, alkynylene, —COO— or —OCO—.

In the present application, the term "single bond" may mean a state where no additional atom is present at the relevant site. For example, here, when L is a single bond, the nitrogen atom is directly connected to the heterocycle.

In the present application, the term "alkyl group, alkoxy group or alkylene group" may mean a linear, branched or cyclic alkyl group, alkoxy group or alkylene group having 1 to 20 carbon atoms, 1 to 16 carbon atoms, 1 to 12 carbon atoms or 1 to 8 carbon atoms. The alkyl group, alkoxy group or alkylene group may be optionally substituted by one or more substituents.

In the present application, the term "alkenyl group, alkenylene group, alkynyl group or alkynylene group" may mean a linear, branched or cyclic alkenyl group, alkenylene group, alkynyl group or alkynylene group having 2 to 20 carbon atoms, 2 to 16 carbon atoms, 2 to 12 carbon atoms, 2 to 8 carbon atoms or 2 to 4 carbon atoms. The alkenyl group, alkenylene group, alkynyl group or alkynylene group may be optionally substituted by one or more substituents.

In the present application, the term "halogen" may be a Group 17 element such as chlorine, bromine or iodine.

In one example, L in Formula 1 may be a single bond or an alkylene group. Specifically, L in Formula 1 may be a single bond or an alkylene group having 1 to 4 carbon atoms.

In one example, $X_1$ in Formula 1 may be a hydrogen atom or an alkyl group, specifically a hydrogen atom or an alkyl group having 1 to 4 carbon atoms. In another example, $X_1$ in Formula 1 may be a hydrogen atom.

In one example, $R_1$ may be an alkyl group or an alkoxy group, specifically, an alkyl group having 1 to 4 carbon atoms or an alkoxy group having 1 to 4 carbon atoms.

In one example, $R_2$ may be an alkyl group or an alkoxy group, specifically, an alkyl group having 1 to 4 carbon atoms or an alkoxy group having 1 to 4 carbon atoms.

In one example, when any one of $R_1$ and $R_2$ is an alkoxy group, the other may be an alkyl group, and specifically, when any one of $R_1$ and $R_2$ is an alkoxy group having 1 to 4 carbon atoms, the other may be an alkyl group having 1 to 4 carbon atoms.

In one example, $R_3$ or $R_4$ may be an alkyl group, an alkenyl group or an alkynyl group, and specifically may be an alkyl group having 4 to 12 carbon atoms, an alkenyl group having 4 to 12 carbon atoms or an alkynyl group having 4 to 12 carbon atoms. In another example, $R_3$ and $R_4$ may also be the same or different from each other.

In the pressure-sensitive adhesive composition of the present application, the compound of Formula 1 above may also be applied alone as the ultraviolet absorber.

The pressure-sensitive adhesive composition of the present application may further comprise a crosslinking agent. For example, the crosslinking agent may react with the pressure-sensitive adhesive polymer through application of heat to form a crosslinked structure. In one example, the crosslinking agent may be a multifunctional crosslinking agent. The multifunctional crosslinking agent may mean a compound containing at least two functional groups capable of forming a crosslinking reaction with the components of the monomer units constituting the pressure-sensitive adhesive polymer.

As the crosslinking agent, for example, a crosslinking agent such as an isocyanate crosslinking agent, an epoxy crosslinking agent, an aziridine crosslinking agent and a metal chelate crosslinking agent may be used.

As the isocyanate crosslinking agent, a multifunctional isocyanate compound such as tolylene diisocyanate, xylene diisocyanate, diphenylmethane diisocyanate, hexamethylene diisocyanate, isoboron diisocyanate, tetramethylxylene diisocyanate, or a compound obtained by reacting the multifunctional isocyanate compound with a polyol compound such as trimethylolpropane, and the like can be used.

As the epoxy crosslinking agent, one or more selected from the group consisting of ethylene glycol diglycidyl ether, triglycidyl ether, trimethylolpropane triglycidyl triglycidyl ether, N,N,N',N'-tetraglycidylethylenediamine and glycerin diglycidyl ether can be used.

As the aziridine crosslinking agent, one or more selected from the group consisting of N,N'-toluene-2,4-bis(1-aziridinecarboxamide), N,N'-diphenylmethane-4,4'-bis(1-aziridinecarboxamide), triethylene melamine, bisisoprothaloyl-1-(2-methyl aziridine) and tri-1-aziridinylphosphine oxide can be used.

The metal chelate crosslinking agent may be exemplified by a compound in which a polyvalent metal such as aluminum, iron, zinc, tin, titanium, antimony, magnesium and/or vanadium is coordinated to acetyl acetone or ethyl acetoacetate and the like, but is not limited thereto.

In one example, the pressure-sensitive adhesive composition may comprise a crosslinking agent in a ratio of 0.01 parts by weight to 10 parts by weight relative to 100 parts by weight of the pressure-sensitive adhesive polymer. The ratio can be suitably changed in consideration of the cohesive force or durability, and the like of the pressure-sensitive adhesive. For example, in another example, the ratio may be about 9 parts by weight or less, 8 parts by weight or less, 7 parts by weight or less, 6 parts by weight or less, 5 parts by weight or less, 4 parts by weight or less, 3 parts by weight or less, 2 parts by weight or less, 1 part by weight or less, 0.5 parts by weight or less, or 0.1 parts by weight or less, or may also be 0.05 part by weight or more or so.

In order to prevent yellowing or the like, in addition to the components, one or more additives selected from the group consisting of an antioxidant, a ultraviolet stabilizer, a heat stabilizer, a plasticizer, an antistatic agent, a filler, a defoaming agent, a surfactant, a nucleating agent, a flame retardant, a weathering stabilizer, a lubricant and a release agent may be further added to the pressure-sensitive adhesive composition in the extent that the object of the present invention can be achieved.

The pressure-sensitive adhesive composition may further comprise a solvent. The solvent may include aromatic hydrocarbons such as toluene, benzene and xylene; aliphatic hydrocarbons such as cyclohexane and decalin; esters such as ethyl acetate and butyl acetate; ketones such as acetone, methyl ethyl ketone and methyl isobutyl ketone; alcohols such as methanol, ethanol, isopropanol, butanol, isobutanol, methyl cellosolve, ethyl cellosolve and butyl cellosolve; ethers such as tetrahydrofuran and dioxane; halogenated hydrocarbons such as dichloromethane, chloroform and carbon tetrachloride; dimethylformamide; dimethyl sulfoxide and the like. These solvents may be used alone or in combination of two or more.

The present application also relates to a pressure-sensitive adhesive layer. The pressure-sensitive adhesive layer may be a layer of the pressure-sensitive adhesive composition. In the present application, the term "layer of a pressure-sensitive adhesive composition" may mean a layer formed by coating or curing a pressure-sensitive adhesive composition.

In this specification, the term "curing of a pressure-sensitive adhesive composition" may mean implementing a crosslinked structure in the pressure-sensitive adhesive composition through physical or chemical action or reaction of components contained in the pressure-sensitive adhesive composition.

In one example, when the pressure-sensitive adhesive composition further comprises a crosslinking agent, the acrylic polymer in the pressure-sensitive adhesive layer may be present in a state crosslinked by the crosslinking agent.

The curing can be induced by performing, for example, maintenance at room temperature, application of moisture, application of heat, irradiation of active energy rays, or two or more processes of the foregoing together. According to each case, the pressure-sensitive adhesive composition having the type that the curing is induced may be referred to as, for example, a room-temperature curing pressure-sensitive adhesive composition, a moisture curing pressure-sensitive adhesive composition, a thermosetting pressure-sensitive adhesive composition, an active energy ray curing pressure-sensitive adhesive composition or a mixed curing pressure-sensitive adhesive composition.

The present application also relates to a polarizing plate. The polarizing plate may comprise a polarizer and a pressure-sensitive adhesive layer. The pressure-sensitive adhesive layer may be a cured product of the pressure-sensitive adhesive composition. Furthermore, the pressure-sensitive adhesive layer may be formed on at least one surface of the polarizer.

In the present application, the term "polarizer" means a film, sheet or element having a polarization function. The polarizer is a functional element capable of extracting light that vibrates in one direction from incident light that vibrates in various directions.

In one example, the polarizer may be an absorbing polarizer. In the present application, the term "absorbing polarizer" means an element exhibiting selective transmission and absorption characteristics with respect to incident light. The polarizer may be a linear polarizer. The absorbing polarizer may transmit light that vibrates in one direction from incident light that vibrates in various directions, and absorb light that vibrates in the other directions.

In one example, the polarizer may be a linear polarizer. In the present application, the term "linear polarizer" means a polarizer, wherein the selectively transmitting light is linearly polarized light that vibrates in any one direction, and the selectively absorbing light is linearly polarized light that vibrates in a direction orthogonal to the vibration direction of the linearly polarized light.

As the polarizer, for example, a polarizer in which iodine is dyed on a polymer stretched film such as a PVA (poly (vinyl alcohol)) stretched film, or a guest-host polarizer in which liquid crystals polymerized in an oriented state are used as a host, and anisotropic dyes arranged in accordance with the orientation of the liquid crystals are used as a guest may be used, without being limited thereto.

A PVA (poly(vinyl alcohol)) stretched film can be used as the polarizer. The transmittance and the polarization degree of the polarizer can be appropriately adjusted in consideration of the object of the present application. For example, the transmittance of the polarizer may be 42.5% to 55%, and the polarization degree may be 65% to 99.9997%.

The thickness of the pressure-sensitive adhesive layer can be appropriately adjusted in consideration of the object of the present application. The pressure-sensitive adhesive layer may have a thickness of, for example, 1 μm to 30 μm or so. The thickness of the pressure-sensitive adhesive layer may be specifically 1 μm or more, 3 μm or more, or 5 μm or more, and may be 25 μm or less, 20 μm or less, or 15 μm or less. Within such a thickness range, it may be advantageous to provide a pressure-sensitive adhesive composition having excellent performance to block ultraviolet rays in the blue region, color characteristics of a polarizing plate and durability upon reliability evaluation.

The pressure-sensitive adhesive layer may have particularly excellent blocking properties against ultraviolet rays including a blue region of 380 nm or more. The polarizing plate comprising the pressure-sensitive adhesive layer may have transmittance of 0.6% or less for light having a wavelength range of, for example, 380 nm or more to 400 nm or less. In another example, the transmittance may be 0.5% or less, 0.4% or less, 0.3% or less, or 0.25% or less, and may be 0.0001% or more, 0.00015% or more, or 0.0002% or more.

In another example, the polarizing plate comprising the pressure-sensitive adhesive layer may have transmittance of less than 20% for light having a wavelength range of, for example, more than 400 nm to 410 nm or less. In another example, the transmittance may be 15% or less, 10% or less, 9% or less, 8% or less, 7% or less, 6% or less, 5% or less, or 4.5% or less, and may be 0.1% or more, 0.12% or more, 0.14% or more, 0.16% or more, 0.18% or more, or 0.2% or more.

In this specification, the term "transmittance in a wavelength range" may be transmittance for any one specific wavelength within the wavelength range, may be transmittance for some wavelength range within the range, may be transmittance for all wavelengths within the range, or may mean an average value for all wavelengths in the range.

The polarizing plate may have excellent color characteristics. For example, the polarizing plate may have, in the CIE Lab color coordinate system, a b value of 9.5 or less, 9 or less, 8.5 or less, 8.0 or less, 7.5 or less, 7 or less, 6.5 or less, or 6 or less. The ab color coordinate system may mean ab color coordinates of a color coordinate system known as Lab. The Lab coordinate system is a color coordinate system on the basis of C.I.E. (Commission Internaltion de L'Eclairage) chromaticity diagrams, which is a coordinate system for displaying colors based on a lightness element (L) and two color axes (ab). In the Lab coordinate system, the a axis is a two color axis of green and red, and the b axis is a two color axis of blue and yellow. The higher the b value, the more yellowish the polarizing plate, where if the b value is too high, the polarizing plate becomes too yellowish and thus visual appreciation of the entire product can also be problematic. The lower limit of the b value may be, for example, 1 or more, 1.5 or more, 2 or more, 2.5 or more, 3 or more, 3.5 or more, 4 or more, or 4.5 or more. The a value may be, for example, −5.0 to −2.0 or 4.0 to −2.5. The color value required for the polarizing plate can be appropriately adjusted in consideration of the kind of the product to which the polarizing plate is applied, the demand of the customer, etc., but in view of not causing a problem in visual appreciation of the product, for example, the b value of 4 to 8 or so may be appropriate. By formulating the ultraviolet absorber having the structure of Formula 1 above alone, the present application does not deviate greatly from the appropriate b value range of the polarizing plate while effectively blocking the light having a blue region, so that it may exhibit excellent optical characteristics.

The polarizing plate may have excellent durability. In one example, the polarizing plate may not cause lifting at the interface of the pressure-sensitive adhesive layer and the polarizer in high temperature reliability evaluation at a temperature of 80° C. or reliability evaluation to store it at a temperature of 60° C. and 90% relative humidity for 1000 hours.

The pressure-sensitive adhesive layer may directly contact the polarizer, or another layer may exist between the pressure-sensitive adhesive layer and the polarizer.

In one example, the polarizing plate may further comprise a retardation layer. The retardation layer may have a function of converting circularly polarized light into linearly polarized light or linearly polarized light into circularly polarized light.

In one example, the retardation layer may have a quarter-wavelength phase retardation characteristic. In the present application, the term "n-wavelength phase retardation characteristic" means a characteristic capable of phase-delaying incident light by n times the wavelength of the incident light in at least a part of the wavelength range.

In one example, the retardation layer may have an in-plane retardation value for light having a wavelength of 550 nm in a range of 90 nm to 300 nm. In another example, the in-plane retardation may be 100 nm or more, 105 nm or more, 110 nm or more, 115 nm or more, 120 nm or more, 125 nm or more, or 130 nm or more, and may be 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, or 145 nm or less.

In the present application, the term "in-plane retardation (Rin)" is a value determined according to the following equation 1:

$$Rin = d \times (nx - ny) \quad [\text{Equation 1}]$$

In Equation 1, d is the thickness of the retardation layer, and nx, ny and nz denote the refractive indexes of the retardation layer in the x-axis, y-axis and z-axis directions, respectively. The x-axis means a direction parallel to the planar slow axis of the retardation layer, the y-axis means a direction parallel to the planar fast axis of the retardation layer, and the z-axis means the thickness direction of the retardation layer. The slow axis direction means a direction having the greatest refractive index on the plane, the fast axis direction means a direction orthogonal to the slow axis on the plane of the retardation layer, and the thickness direction means the normal direction of the plane formed by the slow axis and the fast axis.

In this specification, the term "refractive index" means a refractive index for light having a wavelength of about 550 nm, unless otherwise specified.

The slow axis of the retardation layer may form about 40 degrees to 50 degrees, about 43 degrees to 47 degrees, and preferably about 45 degrees with the absorption axis of the polarizer. The retardation layer may be a polymer stretched film or a cured layer of a liquid crystal compound.

The retardation layer may have a reverse wavelength dispersion property. In the present application, the term "reverse wavelength dispersion property" may mean a property satisfying the following equation 2:

$$Rin(450) < Rin(550) \quad [\text{Equation 2}]$$

In Equation 2, Rin (450) and R (550) are each the in-plane retardation for light having wavelengths of 450 nm and 550 nm.

When the polarizing plate comprises a retardation layer, the pressure-sensitive adhesive layer may exist on the outside of the retardation layer.

In the present application, the term "outside of the retardation layer" may mean a position on the opposite side of the polarizer side based on the retardation layer, which may include a position that directly contacts the retardation layer or a position that does not directly contact it. In this specification, the term "outside of the polarizer" may mean a position on the opposite side of the retardation layer side based on the polarizer, which may include a position that directly contacts the polarizer or a position that does not directly contact it.

In one example, as shown in FIG. 1, the polarizer (10) may exist between the pressure-sensitive adhesive layer (30) and the retardation layer (20). In the polarizing plate according to the structure of FIG. 1, an intermediate layer to be described below, for example, a polarizer protective film, a retardation film other than the retardation layer, or a base film of the retardation film, and the like may be included or may not be included between the pressure-sensitive adhesive layer (30) and the polarizer (10). According to this structure, it can protect a liquid crystal alignment film further included in the polarizing plate from additional ultraviolet rays, thereby being advantageous. The liquid crystal alignment film may be used when a liquid crystal film (a cured layer of a liquid crystal compound) is used as the retardation layer.

The polarizing plate may further comprise an additional layer in addition to the retardation layer.

In one example, the polarizing plate may further comprise one or more layers of an upper layer existing outside the polarizer, a lower layer existing outside the retardation layer, and an intermediate layer existing between the polarizer and the retardation layer. The pressure-sensitive adhesive layer may be present at one or more of positions between the polarizer and the upper layer, between the polarizer and the intermediate layer, between the retardation layer and the intermediate layer, between the retardation layer and the lower layer, outside the polarizer and outside the retardation layer.

As shown in FIG. 2, the upper layer (103) may be laminated on the opposite side of the polarizer (101) facing the retardation layer (102). In this case, the pressure-sensitive adhesive layer may be present at one or more of positions outside the upper layer, between the upper layer and the polarizer, between the polarizer and the retardation layer and outside the retardation layer.

As the type of the upper layer, a protective film of a polarizer, a hard coating layer, a retardation film other than the retardation layer, an antireflective layer or a liquid crystal coating layer, and the like can be exemplified, without being limited thereto. The specific type of each constitution used as the upper layer is not particularly limited, and for example, various kinds of films used for constituting an optical film such as a polarizing plate in the industry can be used without limitation. The upper layer may be a single layer of the illustrated layers or may have a multi-layer structure comprising the laminated structure of two or more layers in the illustrated layers.

As shown in FIG. 3, the lower layer (203) may be laminated on the opposite side of the surface of the retardation layer (202) facing the polarizer (201). In this case, the pressure-sensitive adhesive layer may be present at one or more of positions outside the lower layer, between the lower layer and the retardation layer, between the polarizer and the retardation layer, and outside the polarizer. In the case of FIG. 3, an upper layer as shown in FIG. 2 may be added. For example, as shown in FIG. 3, an upper layer such as a hard coating layer or a low reflection layer may be present on the outer side of the polarizer in the state where the lower layer exists, and a protective film may also be present on one side or both sides of the polarizer.

As the type of the lower layer, a pressure-sensitive adhesive layer or an adhesive layer for attaching a retardation film other than the retardation film, or the polarizing plate to another element, an adhesive layer, or a protective film or release film for protecting the pressure-sensitive adhesive layer or the adhesive layer can be exemplified. In this case, the pressure-sensitive adhesive layer as the lower layer may also be the above-described pressure-sensitive adhesive layer of the present application. The lower layer may be a single layer of the illustrated layers or may have a multi-layer structure comprising the laminated structure of two or more layers in the illustrated layers.

As shown in FIG. 4, the intermediate layer (303) may exist between the polarizer (301) and the retardation layer (302). In this case, the pressure-sensitive adhesive layer may be present at one or more of positions outside the polarizer, between the intermediate layer and the polarizer, between the intermediate layer and the retardation layer, and outside the retardation layer. Although not shown in the structure of FIG. 4, the upper layer in the structure of FIG. 2 and/or the lower layer in the structure of FIG. 3 may also be present.

As the intermediate layer, the above-mentioned polarizer protective film, a retardation film other than the retardation layer, or a base film of the retardation layer can be exemplified. The intermediate layer may be a single layer of the illustrated layers or may have a multi-layered structure comprising the laminated structure of two or more layers in the illustrated layers.

As the protective film of the polarizer or the base film of the retardation layer, for example, a cellulose film such as a TAC (triacetyl cellulose) film; a polyester film such as a PET (poly(ethylene terephthalate)) film; a polycarbonate film; a polyethersulfone film; an acrylic film and/or a polyolefin-based film such as a polyethylene film, a polypropylene film, a polyolefin film containing a cyclo or norbornene structure or an ethylene-propylene copolymer film, and the like can be used, without being limited thereto.

As the retardation film other than the retardation layer, a retardation film having a positive thickness direction retardation value may be exemplified. In this specification, the term "thickness direction retardation (Rth)" may be a value determined according to the following equation 3. When the polarizing plate further comprises a retardation film having a positive thickness direction retardation value, it may have excellent antireflection characteristics and color characteristics at a viewing angle. As the retardation film, a retardation film satisfying the following equation 4 or 5 can be used. The retardation film satisfying the following equation 4 can be called a +C plate, and the retardation film satisfying the following equation 5 can be called a +B plate. Such a retardation film can be exemplified by a polymer stretched film, a vertically oriented liquid crystal layer, a splay oriented liquid crystal layer or a tilt oriented liquid crystal layer, and the like, but is not limited thereto. In one example, the projection of the optical axis (slow axis) of the retardation film onto a plane may be parallel or orthogonal to the absorption axis of the polarizer.

$$Rth = d \times (nz - ny) \quad \text{[Equation 3]}$$

$$nx = ny < nz \quad \text{[Equation 4]}$$

$$nx > ny \text{ and } nz > ny \quad \text{[Equation 5]}$$

In Equation 3, d is the thickness of the retardation layer, and in Equations 3 to 5, nx, ny and nz are each as defined above.

FIGS. 5 and 6 each illustratively show a structure of a polarizing plate according to one example of the present application.

The polarizing plate according to FIG. 5 may comprise a hard coating layer (403), a polarizer (401), a polarizer protective film (404), a first pressure-sensitive adhesive layer (405), a retardation layer base film (406), a retardation layer (402), a +C plate (407) and a second pressure-sensitive adhesive layer (408) sequentially. The pressure-sensitive adhesive layer of the present invention as described above can be used as the first pressure-sensitive adhesive layer and/or the second pressure-sensitive adhesive layer, and for example, can be used as the first pressure-sensitive adhesive layer.

The polarizing plate according to FIG. 6 may comprise a hard coating layer (403), a polarizer (401), a first pressure-sensitive adhesive layer (405), a retardation layer base film (406), a retardation layer (402), a +C plate (407) and a second pressure-sensitive adhesive layer (408) sequentially.

The pressure-sensitive adhesive layer of the present invention as described above can be used as the first pressure-sensitive adhesive layer and/or the second pressure-sensitive adhesive layer, and for example, can be used as the first pressure-sensitive adhesive layer.

The present application relates to an organic light emitting device. The organic light emitting device may include a polarizing plate and an organic light emitting panel. When the polarizing plate comprises a retardation layer, the retardation layer may be disposed to be adjacent to the organic light emitting panel as compared to the polarizer.

FIG. 7 illustratively shows a structure of the organic light emitting device of the present application. As shown in FIG. 7, the organic light emitting device may comprise a substrate (701), a first electrode layer (702), an organic light emitting layer (703) and a second electrode layer (704) in this order, and a polarizing plate (100) may be present on the side where the light is emitted from the organic light emitting panel. The polarizing plate may be attached to the side where the light is emitted from the organic light emitting panel via the above-described pressure-sensitive adhesive layer.

As described above, the polarizing plate has excellent blocking characteristics against light having a blue region wavelength of 380 nm or more, so that it is possible to protect the blue light source in the organic light emitting device, particularly, the light emitting layer, from external light.

As the substrate, a plastic substrate can be used. The organic light emitting device comprising the plastic substrate may be advantageous in the implementation of a rollable, flexible or bendable organic light emitting device.

The plastic substrate may comprise a polymer. The polymer may be exemplified by polyimide, polyamic acid, polyethylene naphthalate, polyether ether ketone, polycarbonate, polyethylene terephthalate, polyether sulfide, polysulfone or an acrylic polymer, and the like. In one example, in terms of process temperatures, the plastic substrate may comprise polyimide with excellent high-temperature durability.

As the substrate, a translucent substrate can be used. The translucent substrate may have, for example, transmittance of 50% or more, 60% or more, 70% or more, or 80% for light in the visible light region.

One of the first electrode layer and the second electrode layer may be an anode and the other may be a cathode. The anode is an electrode to which holes are injected, which may be made of a conductive material having a high work function, and the cathode is an electrode to which electrons are injected, which may be made of a conductive material having a low work function. In one example, the first electrode layer may be an anode and the second electrode layer may be a cathode. In one example, the anode may be a transparent electrode, and the cathode may be a reflective electrode. The anode may comprise a transparent metal oxide, for example, ITO, IZO, AZO, GZO, ATO or $SnO_2$, and the like. The cathode may comprise a metal, for example, Ag, Au, Al or the like.

The organic light emitting layer may comprise an organic material capable of emitting light when power has been applied to the first electrode layer and the second electrode layer. In a structure referred to as a so-called bottom emitting device, the first electrode layer may be formed of a transparent electrode layer, and the second electrode layer may be formed of a reflective electrode layer. Also, in a structure referred to as a so-called top emitting device, the first electrode layer is formed of a reflective electrode layer, and the second electrode layer is formed of a transparent electrode layer. Electrons and holes injected by the electrode layers may be recombined in the organic light emitting layer to generate light. The light can be emitted toward the substrate in the bottom emitting device and toward the second electrode layer in the top emitting device.

The organic emitting layer may comprise a red emitting layer, a green emitting layer and a blue emitting layer. The emitting layers may comprise known organic materials that emit red, green and blue, respectively. In one example, the organic light emitting device may be driven by a method (RGB method) that three primary color light emitting layers form one pixel (dot, picture element) while emitting different colors, respectively, or may be driven by a method (WOLED method) that one pixel is formed by laminating the three primary color light emitting layers so as to emit white and then various colors are implemented by disposing a color filter layer on the top of the white light emitting layer.

The organic light emitting panel may further comprise sub-layers between the first electrode layer and the organic light emitting layer and between the second electrode layer and the organic light emitting layer. The sub-layer may include a hole transporting layer, a hole injecting layer, an electron injecting layer, and an electron transporting layer for balancing electrons and holes, but is not limited thereto.

The organic light emitting display panel may further comprise an encapsulation substrate. The encapsulation substrate may be present on the second electrode layer. The encapsulation substrate may be made of glass, a metal and/or a polymer, and may encapsulate the first electrode layer, the organic light emitting layer and the second electrode layer to prevent moisture and/or oxygen from being introduced from the outside.

The polarizing plate may be disposed on a side where light is emitted from the organic light emitting device. For example, in the case of a bottom emission structure in which light is emitted toward the substrate, it may be disposed outside the substrate, and in the case of a top emission structure in which light is emitted toward the encapsulation substrate, it may be disposed outside the encapsulation substrate. The polarizing plate can improve the visibility of the organic light emitting device by preventing external light from being reflected by a reflective layer made of a metal, such as electrodes and wiring of the organic light emitting device, and coming out of the organic light emitting device.

Advantageous Effects

The polarizing plate to which the pressure-sensitive adhesive composition of the present application is applied has an advantage that the performance capable of blocking the blue light, for example, the light having a wavelength region of 380 nm or more, is particularly excellent, when attached to an organic light emitting panel, especially, an organic light emitting panel comprising a plastic substrate.

BRIEF DESCRIPTION OF DRAWINGS

FIGS. 1 to 6 are diagrams illustratively showing structures of polarizing plates.

FIG. 7 is a diagram illustratively showing a structure of an organic light emitting device.

BEST MODE

Hereinafter, the present application will be described in more detail by way of examples, but the scope of the present application is not limited to the following examples.

Example 1

Preparation of Pressure-Sensitive Adhesive Composition

To a 1 L reactor with refluxing nitrogen gas and equipped with a cooling device so as to easily adjust a temperature, n-butyl acrylate (n-BA) and 4-hydroxybutyl acrylate (4-HBA) were introduced in a weight ratio of 99:1 (n-BA: 4-HBA). Subsequently, ethyl acetate (EAc) as a solvent was introduced to the reactor in a ratio of 180 parts by weight relative to 100 parts by weight of the sum of n-butyl acrylate and 4-hydroxybutyl acrylate, and nitrogen gas was purged for 60 minutes for oxygen removal. Thereafter, while maintaining the temperature at 67° C., AIBN (azobisisobutyronitrile) as a reaction initiator was introduced in an amount of 0.05 parts by weight relative to 100 parts by weight of the sum of n-butyl acrylate and 4-hydroxybutyl acrylate, followed by reaction for 8 hours. After the reaction, the reaction product was diluted with ethyl acetate to obtain an acrylic polymer having a solid content concentration of 30 wt % and a weight average molecular weight of 1,000,000.

About 4 parts by weight of an ultraviolet absorber (FDB-009, manufactured by Yamada, maximum absorption wavelength: about 394 nm) having the following formula A and about 0.1 parts by weight of a crosslinking agent (XDI-based isocyanate compound, T-39M manufactured by Mitsui chemicals) were formulated relative to 100 parts by weight of the solid content of the acrylic polymer to prepare a pressure-sensitive adhesive composition.

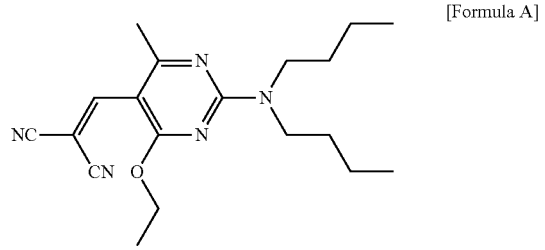 [SMILES: CCCCN(CCCC)c1nc(C)c(C=C(C#N)C#N)c(OCC)n1]

[Formula A]

Production of Pressure-Sensitive Adhesive Layer

The pressure-sensitive adhesive composition was coated on a release-treated surface of a release-treated PET (poly (ethylene terephthalate)) film (thickness: 38 μm, MRF-38, manufactured by Mitsubishi) to have a thickness of about 10 μm or so after drying, and heat-cured in an oven at 80° C. for 3 minutes to produce a pressure-sensitive adhesive layer.

Production of Polarizing Plate

A polarizing plate was prepared by laminating the prepared pressure-sensitive adhesive layer on one side of a known polarizing plate on which both sides of a PVA (poly(vinyl alcohol)) series polarizer were protected with a TAC (triacetyl cellulose) protective film having a thickness of about 60 μm.

Example 2

A pressure-sensitive adhesive composition, a pressure-sensitive adhesive layer and a polarizing plate were sequentially produced in the same manner as in Example 1, except that the amount of the ultraviolet absorber of Formula A was changed to a ratio of about 3.5 parts by weight relative to 100 parts by weight of the solid content of the acrylic polymer upon preparing the pressure-sensitive adhesive composition.

Example 3

A pressure-sensitive adhesive composition, a pressure-sensitive adhesive layer and a polarizing plate were sequentially produced in the same manner as in Example 1, except that the amount of the ultraviolet absorber of Formula A was changed to a ratio of about 3 parts by weight relative to 100 parts by weight of the solid content of the acrylic polymer upon preparing the pressure-sensitive adhesive composition.

Example 4

A pressure-sensitive adhesive composition, a pressure-sensitive adhesive layer and a polarizing plate were sequentially produced in the same manner as in Example 1, except that the amount of the ultraviolet absorber of Formula A was changed to a ratio of about 2.5 parts by weight relative to 100 parts by weight of the solid content of the acrylic polymer upon preparing the pressure-sensitive adhesive composition.

Example 5

A pressure-sensitive adhesive composition, a pressure-sensitive adhesive layer and a polarizing plate were sequentially produced in the same manner as in Example 1, except that the amount of the ultraviolet absorber of Formula A was changed to a ratio of about 2 parts by weight relative to 100 parts by weight of the solid content of the acrylic polymer upon preparing the pressure-sensitive adhesive composition.

Comparative Example 1

A pressure-sensitive adhesive composition, a pressure-sensitive adhesive layer and a polarizing plate were sequentially produced in the same manner as in Example 1, except that an ultraviolet absorber (UV390, manufactured by Eutec, maximum absorption wavelength: 387 nm) of the following Formula B instead of the ultraviolet absorber of Formula A was formulated in an amount of about 0.4 parts by weight relative to 100 parts by weight of the solid content of the acrylic polymer and an ultraviolet absorber (UV1990, manufactured by Eutec, maximum absorption wavelength: 384 nm) of the following Formula C was also formulated in an amount of about 4.5 parts by weight relative to 100 parts by weight of the solid content of the acrylic polymer upon preparing the pressure-sensitive adhesive composition.

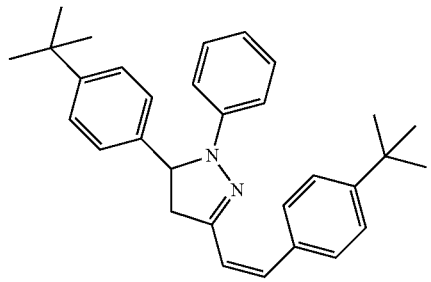

[Formula B]

-continued

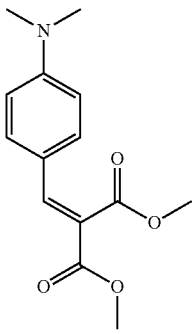

[Formula C]

Comparative Example 2

A pressure-sensitive adhesive composition, a pressure-sensitive adhesive layer and a polarizing plate were sequentially produced in the same manner as in Example 1, except that the ultraviolet absorber (UV390, manufactured by Eutec, maximum absorption wavelength: 387 nm) of Formula B above instead of the ultraviolet absorber of Formula A was formulated in an amount of about 0.4 parts by weight relative to 100 parts by weight of the solid content of the acrylic polymer and the ultraviolet absorber (UV1990, manufactured by Eutec, maximum absorption wavelength: 384 nm) of Formula C above was also formulated in an amount of about 5 parts by weight relative to 100 parts by weight of the solid content of the acrylic polymer upon preparing the pressure-sensitive adhesive composition.

Comparative Example 3

A pressure-sensitive adhesive composition, a pressure-sensitive adhesive layer and a polarizing plate were sequentially produced in the same manner as in Example 1, except that an ultraviolet absorber (UV1995, manufactured by Eutec) of the following Formula D instead of the ultraviolet absorber of Formula A was formulated in an amount of about 2 parts by weight relative to 100 parts by weight of the solid content of the acrylic polymer upon preparing the pressure-sensitive adhesive composition.

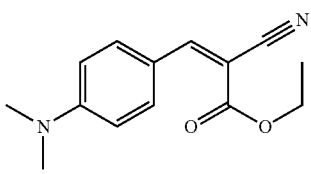

[Formula D]

Evaluation Example 1 Optical Property Evaluation of Polarizing Plate

The polarizing plates of Examples and Comparative Examples were cut to a size of 25 mm×25 mm (width× length) to prepare specimens. The ultraviolet blocking performance including the blue region was evaluated by measuring the transmittance of the polarizing plate using an ultraviolet-visible light spectrometer (V-7100, manufactured by JASCO), and the results were described in Table 1. The light transmittance in Table 1 below represents the percentage of the light transmission amount when the total light transmittance is set to 100. From Table 1 below, it can be confirmed that Examples 1 to 5 have excellent ultraviolet blocking properties while exhibiting low transmittance for light having a wavelength of 380 nm to 410 nm.

Evaluation Example 2 Color Characteristic Evaluation of Polarizing Plate

The polarizing plates of Examples and Comparative Examples were cut to a size of 25 mm×25 mm (width× length) to prepare specimens. The visual appreciation characteristics of the polarizing plate were evaluated by measuring the color coordinates of the polarizing plate using an ultraviolet-visible light spectrometer (V-7100, manufactured by JASCO), and the results were described in Table 1. From the measurement results shown in Table 1, in the case of Examples, the change in the b values is not large, and thus it can be confirmed that they have excellent visual appreciation characteristics.

From the following Table 1, the ultraviolet absorber having the structure of Formula A above can be applied alone to satisfy the color characteristics required for the polarizing plate, but Comparative Examples 1 and 2 can satisfy the color characteristics required for the polarizing plate only when the pyrazoline-based ultraviolet absorber and the malonic acid-based ultraviolet absorber have been mixed and applied, so that it is effective to apply the pressure-sensitive adhesive composition having the structure specified in the present application. Also, in the case of Comparative Example 3 in which the cyanoacetate-based ultraviolet absorber is applied alone, the specification of the transmittance in a small amount is satisfied, but the value of b is too high and it becomes yellowish, so that it may be a problem in terms of the optical characteristic specification or the visual appreciation. It is an important factor to satisfy the transmittance of less than 0.5% at 380 to 400 nm and less than 5% at 410 nm while suppressing the change in the existing optical characteristics of the polarizing plate.

Evaluation Example 3 Durability Evaluation Under Reliability Conditions

Specimens prepared by cutting the polarizing plates prepared in Examples and Comparative Examples to a size of 90 mm×170 mm (width×length) were prepared by two sheets for each of Examples and Comparative Examples. Subsequently, the two specimens as prepared were attached to both sides of a glass substrate (110 mm×190 mm×0.7 mm=width×length×thickness) so that the optical absorption axes of the respective polarizing plates were crossed to prepare a sample. The pressure applied at the time of attachment was about 5 Kg/cm$^2$, and the work was performed in a clean room so that bubbles or foreign matters did not occur at the interfaces. The prepared sample was placed in a reliability chamber and allowed to stand for 1,000 hours under the conditions of a temperature of 60° C. and 90% relative humidity, and then the occurrence of lifting at the pressure-sensitive adhesive layer interface was observed. The durability evaluation criteria are as follows.

<Durability Evaluation Criteria>
⊚: No lifting occurred
O: Minor lifting occurred
Δ: Lifting occurred
x: Large lifting occurred

TABLE 1

| | | Transmittance (%) | | | | Color coordinates | | Durability |
|---|---|---|---|---|---|---|---|---|
| | | 380 nm | 390 nm | 400 nm | 410 nm | a | b | ☺ |
| Example | 1 | 0.00023 | 0.00062 | 0.01243 | 0.23347 | −3.72935 | 5.83753 | ☺ |
| | 2 | 0.00074 | 0.00132 | 0.02342 | 0.52392 | −3.45231 | 5.52932 | ☺ |
| | 3 | 0.00192 | 0.00226 | 0.01253 | 1.10933 | −3.13238 | 5.22412 | ☺ |
| | 4 | 0.00087 | 0.00426 | 0.05611 | 2.17196 | −2.89218 | 4.95563 | ☺ |
| | 5 | 0.00323 | 0.01342 | 0.23421 | 4.31381 | −2.54231 | 4.68382 | ☺ |
| Comparative | 1 | 0.00096 | 0.00643 | 0.11608 | 2.82668 | −3.43324 | 6.25213 | ☺ |
| Example | 2 | 0.00041 | 0.00861 | 0.12057 | 2.73922 | −3.46528 | 6.31497 | ☺ |
| | 3 | 0.00309 | 0.10822 | 0.2716 | 0.19523 | −13.0241 | 23.99735 | ☺ |

EXPLANATION OF REFERENCE NUMERALS

10: polarizer, 20: retardation layer, 30: pressure-sensitive adhesive layer
101, 201, 301, 401: polarizer, 102, 202, 302, 402: retardation layer,
103: upper layer, 203: lower layer, 303: intermediate layer
403: hard coating layer, 404: polarizer protective film, 405: first pressure-sensitive adhesive layer, 406: retardation layer base film, 407: +C plate, 408: second pressure-sensitive adhesive layer
100: polarizing plate, 701: substrate, 702: first electrode layer, 703: organic light emitting layer, 704: second electrode layer

The invention claimed is:

1. An organic light emitting device comprising an organic light emitting panel and a polarizing plate,
   wherein the organic light emitting panel comprises a plastic substrate, a first electrode layer, an organic light emitting layer and a second electrode layer in this order,
   wherein the polarizing plate is attached to a side where a light is emitted from the organic light emitting panel via a pressure-sensitive adhesive layer,
   wherein the polarizing plate comprises the pressure-sensitive adhesive layer, and has a b value of 4.5 more and 6 or less in CIE Lab color coordinates, and
   wherein the pressure-sensitive adhesive layer comprises a cured product of a pressure-sensitive adhesive composition comprising a pressure-sensitive adhesive polymer and an ultraviolet absorber comprising a compound of the following formula 1, the pressure-sensitive adhesive polymer has a weight average molecular weight of 800,000 or more and 1,200,000 or less, and the ultraviolet absorber is in a ratio of 2 parts by weight to 4 parts by weight relative to 100 parts by weight of the pressure-sensitive adhesive polymer,

[Formula 1]

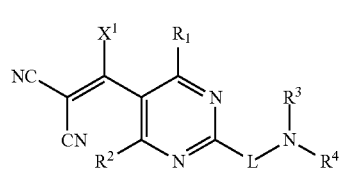

wherein, $X_1$ and $R_1$ to $R_4$ are each independently a hydrogen atom, a halogen atom, an alkyl group, an alkenyl group, an alkynyl group, an alkoxy group or an alkoxycarbonyl group, and L is a single bond, alkylene, alkenylene, alkynylene, —COO— or —OCO—.

2. The organic light emitting device according to claim 1, wherein L in Formula 1 is a single bond or an alkylene group, $X_1$ is a hydrogen atom or an alkyl group, $R_1$ or $R_2$ is an alkyl group or an alkoxy group, and $R_3$ or $R_4$ is an alkyl group, an alkenyl group or an alkynyl group.

3. The organic light emitting device according to claim 1, wherein L in Formula 1 is a single bond or an alkylene group having 1 to 4 carbon atoms, $X_1$ is a hydrogen atom, $R_1$ and $R_2$ are each independently an alkyl group having 1 to 4 carbon atoms or an alkoxy group having 1 to 4 carbon atoms, and $R_3$ and $R_4$ are each independently an alkyl group having 4 to 12 carbon atoms, provided that when any one of $R_1$ and $R_2$ is an alkyl group having 1 to 4 carbon atoms, the other is an alkoxy group having 1 to 4 carbon atoms.

4. The organic light emitting device according to claim 1, wherein the maximum absorption wavelength of the ultraviolet absorber is in a range of 380 nm to 410 nm.

5. The organic light emitting device according to claim 1, wherein the half-value width of the ultraviolet absorber at the maximum absorption wavelength is in a range of 10 nm to 60 nm.

6. The organic light emitting device according to claim 1, wherein the pressure-sensitive adhesive polymer comprises a polymerization unit of an alkyl (meth)acrylate monomer.

7. The organic light emitting device according to claim 6, wherein the pressure-sensitive adhesive polymer further comprises a polymerization unit of a copolymerizable monomer having a polar functional group.

8. The organic light emitting device according to claim 7, wherein the polar functional group is a hydroxyl group, a carboxyl group or an anhydride group thereof, an acid group, a glycidyl group, an amino group or an isocyanate group.

9. The organic light emitting device according to claim 7, wherein the polymerization unit of a copolymerizable monomer having a polar functional group is in a ratio of about 0.1 parts by weight to 30 parts by weight relative to 100 parts by weight of the polymerization unit of the alkyl (meth)acrylate monomer.

10. The organic light emitting device according to claim 1, wherein the pressure-sensitive adhesive composition further comprises a crosslinking agent.

11. The organic light emitting device according to claim 10, wherein the crosslinking agent is an isocyanate crosslinking agent, an epoxy crosslinking agent, an aziridine crosslinking agent or a metal chelate crosslinking agent.

12. The organic light emitting device according to claim 10, wherein the crosslinking agent is in a ratio of 0.01 parts by weight to 10 parts by weight relative to 100 parts by weight of the pressure-sensitive adhesive polymer.

13. The organic light emitting device according to claim 1, wherein the polarizing plate further comprises a polarizer and the pressure-sensitive adhesive layer is formed on at least one side of the polarizer.

14. The organic light emitting device according to claim 13, wherein the polarizing plate has transmittance of 0.6% or less for light having a wavelength of 380 nm or more to 400 nm or less, and transmittance of less than 20% for light having a wavelength of more than 400 nm to 410 nm or less.

15. The organic light emitting device according to claim 1, wherein the organic light emitting layer comprise at least one of a red emitting layer, a green emitting layer or a blue emitting layer.

\* \* \* \* \*